(12) United States Patent
Rule et al.

(10) Patent No.: US 7,516,028 B2
(45) Date of Patent: Apr. 7, 2009

(54) USER-PLACED MARKS IN A LONG RECORD LENGTH WAVEFORM

(75) Inventors: Keith D. Rule, Beaverton, OR (US); Lance H. Forsberg, Beaverton, OR (US); Robert L. Beasley, Aloha, OR (US); Steven C. Herring, Beaverton, OR (US); Kenneth P. Dobyns, Beaverton, OR (US); Scott R. Ketterer, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/498,406

(22) Filed: Aug. 2, 2006

(65) Prior Publication Data

US 2007/0038397 A1    Feb. 15, 2007

Related U.S. Application Data

(60) Provisional application No. 60/707,736, filed on Aug. 12, 2005.

(51) Int. Cl.
*G01R 13/02* (2006.01)

(52) U.S. Cl. .............................. 702/68; 702/123; 707/1

(58) Field of Classification Search ............ 702/66–68, 702/70, 71, 73, 120, 121, 183; 348/589; 324/73.1; 707/1
See application file for complete search history.

(56) References Cited

U.S. PATENT DOCUMENTS

| 4,072,851 | A  | * | 2/1978  | Rose ............................. 702/68  |
| 4,812,996 | A  | * | 3/1989  | Stubbs ......................... 702/123 |
| 4,972,138 | A  | * | 11/1990 | Bush ........................... 324/73.1 |
| 6,297,853 | B1 | * | 10/2001 | Sharir et al. ................. 348/589  |
| 6,502,045 | B1 | * | 12/2002 | Biagiotti ....................... 702/66  |
| 2004/0243540 | A1 | * | 12/2004 | Moskowitz et al. ............. 707/1   |

* cited by examiner

*Primary Examiner*—John H Le
(74) *Attorney, Agent, or Firm*—Derek Meeker; Thomas F. Lenihan

(57) ABSTRACT

A test and measurement instrument includes a memory configured to store a digitized signal, a display configured to display the digitized signal, a mark interface configured to generate a mark creation signal, a processor coupled to the memory, the display, and the mark interface. The processor is configured to identify a feature of the digitized signal and create a mark indicating the feature and the digitized signal in response to the mark creation signal.

15 Claims, 7 Drawing Sheets

USER-PLACED MARKS IN A LONG RECORD LENGTH WAVEFORM

CROSS-REFERENCE TO RELATED APPLICATIONS

This application claims priority under 35 U.S.C. § 119(e) from U.S. Provisional Application Ser. No. 60/707,736, filed on Aug. 12, 2005, the contents of which are herein incorporated by reference in their entirety.

BACKGROUND

This disclosure relates to test and measurement instruments and, in particular, to test and measurement instruments having marks.

As the technology for test and measurement instruments advances, longer record lengths have become available for storing digitized signals. Because of such long record lengths, it is impractical for a user to manually examine the digitized signal for interesting events. A user may zoom in on a digitized signal to see interesting events in sufficient detail; however, because of the long record length, it would take the user an unacceptable amount of time to pan the display to search through the digitized signal. The user may zoom out so that panning though the digitized signal may be performed in an acceptable amount of time. However, the level of detail is reduced such that the user may not see interesting events. In addition, positions of the zoom window may be manually entered; however, a user is required to manually record a position of an interesting event and manually enter the position to return to that position.

A conventional logic analyzer (a type of test and measurement instrument) may include a search function that moves a zoom window to display the next event on a digitized signal. However, the current and previous events are not recorded. As a result, the user is prevented from navigating among or recording the positions of the interesting events. Furthermore, the user cannot manually define interesting events.

Cursors have been implemented in test and measurement instruments. However, cursors only indicate a point on a displayed digitized signal. In addition, a cursor cannot be used to navigate around a digitized signal.

Accordingly, there remains a need for an improved method and apparatus for examining digitized signals.

SUMMARY

One aspect of the invention includes a method of operating a test and measurement instrument including receiving an input, identifying a feature of a digitized signal in response to the input, and creating a mark indicating the associated feature and the digitized signal.

Another aspect of the invention includes a test and measurement instrument including a memory configured to store a digitized signal, a display configured to display the digitized signal, a mark interface configured to generate a mark creation signal, and a processor coupled to the memory, the display, and the mark interface. The processor is configured to identify a feature of the digitized signal and create a mark indicating the feature and the digitized signal in response to the mark creation signal.

The foregoing and other aspects of the invention, and advantages thereof, will become more readily apparent from the following detailed description and accompanying drawings.

DETAILED DESCRIPTION

As used in this discussion, a feature of a digitized signal is an identifiable characterization of the digitized signal. For example, the feature may be a position in the digitized signal. The feature may be one or more spans within the digitized signal.

The feature may be a shape of the digitized signal, such as a pulse width, an edge with a particular rise or fall time, or the like. Any characterization of the digitized signal that identifies a portion of the digitized signal may be a feature.

Furthermore, a feature need not uniquely identify only one portion of a digitized signal. For example, a feature may be defined as a pulse with a width less than 10 nanoseconds (ns.). Multiple pulses within a digitized signal may have widths less than 10 ns. Thus, the feature identifies multiple portions of the digitized signal. In addition, a feature may include multiple characterizations of the digitized signal. For example, the feature may be three consecutive rising edges within a specified time period.

In addition, a feature may also include aspects of other digitized signals beyond a single digitized signal it is associated with. For example, a feature of a first digitized signal may be a span of the first digitized signal coincident with a particular pulse of a second digitized signal.

A mark, as used in this discussion, is an identification of a feature in a digitized signal and an association with the digitized signal. Thus, the mark includes a reference or definition of the feature and an identification of that feature in the digitized signal.

For example, the feature may be a rise time of an edge exceeding 1 ns. The identification may be a position within the digitized signal of a center of an edge having a rise time exceeding 1 ns.

Figure 1:
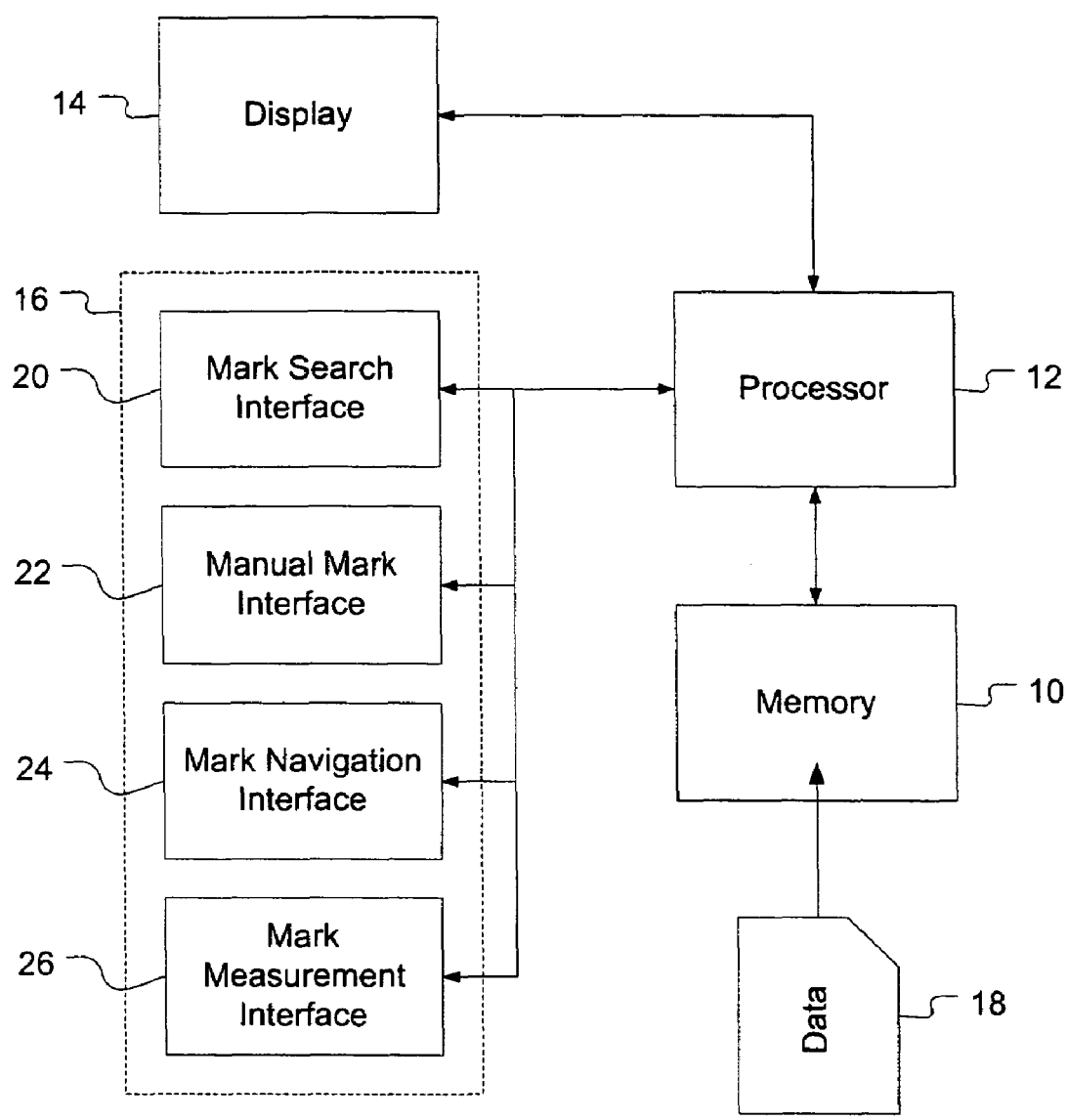
FIG. 1 is a block diagram of a test and measurement instrument according to an embodiment of the invention.

FIG. 1 is a block diagram of a test and measurement instrument according to an embodiment of the invention. The instrument includes a memory 10, a processor 12, a display 14, and a mark interface 16. The memory 10 is configured to store a digitized signal. The display 14 is configured to display the digitized signal. The mark interface 16 is configured to generate a mark creation signal.

The processor 12 is configured to identify a feature of the digitized signal and create a mark indicating the feature and the digitized signal in response to the mark creation signal. Thus, a mark is created allowing a user to easily return to that particular feature for further analysis. Since the feature is identified, the user may examine other portions of the digitized signal without the need to remember the location of that feature.

In particular, with long-record-length digitized signals, it is easy to forget where a particular feature occurred. Even with the forward searching capability described above, the user may not remember the particular feature or features meeting a given search criterion. In addition, the user may have to step through other features meeting the search criterion before getting to the feature of interest. However, with the mark, the user may return to that particular mark as easily as the press of a button.

The mark interface 16 may be any variety of interfaces. The mark interface 16 may include buttons, dials, sliders, front panel controls, and other similar physical interfaces. In addition, the mark interface 16 may include soft-menus or context sensitive controls. Furthermore, the mark interface 16 may be a remote interface such as a General Purpose Interface Bus (GPIB) port or a network interface. Any one or combination of such interfaces may be used.

The mark interface 16 may include a variety of specific interfaces for functions related to marks. Such specific interfaces may include a manual mark interface 22, a mark search interface 20, a mark navigation interface 24, and a mark measurement interface 26. Although illustrated in FIG. 1 as forming a contiguous mark interface 16, the specific interfaces may be part of the same interface, or part of distinct interfaces. For example, the manual mark interface 22 may be a physical interface, the mark search interface 20 may be part of a context-sensitive soft-menu interface, and the mark measurement interface 26 may include a network interface. Any combination of interfaces may be used. Furthermore, each of the specific interfaces may be accessible though any number of implementations of interfaces. For example, the mark search interface 20 may be accessible through a physical interface, a context-sensitive soft-menu interface, and a GPIB port.

The manual mark interface 22 is configured to generate a manual mark creation signal. The processor 12 is configured to determine a focus associated with the manual mark creation signal, and create a mark in response to the focus. As used in this discussion, a focus is the digitized signal or signals that the user desires to associate with the mark. Multiple digitized signals may be displayed at any one time. As a result, in connection with the creation of marks, there may be some confusion concerning which digitized signals are to have marks.

One example of the focus includes all displayed digitized waveforms. Thus, features are identified on each digitized signal and marks are created for each digitized signal. As a result, the user need not keep track of a selected waveform. Furthermore, if a digitized signal is moved relative to the other digitized signals, its associated mark or marks can track the movement.

Although one example of determining the focus has been described, the focus associated with the input may include a variety of combinations. For example, only one selected digitized signal may be included in the focus. Alternatively, all received digitized signals, including signals not currently displayed, may be included in the focus. Furthermore, a subset of displayed or available digitized signals may be included in the focus.

Figure 2:
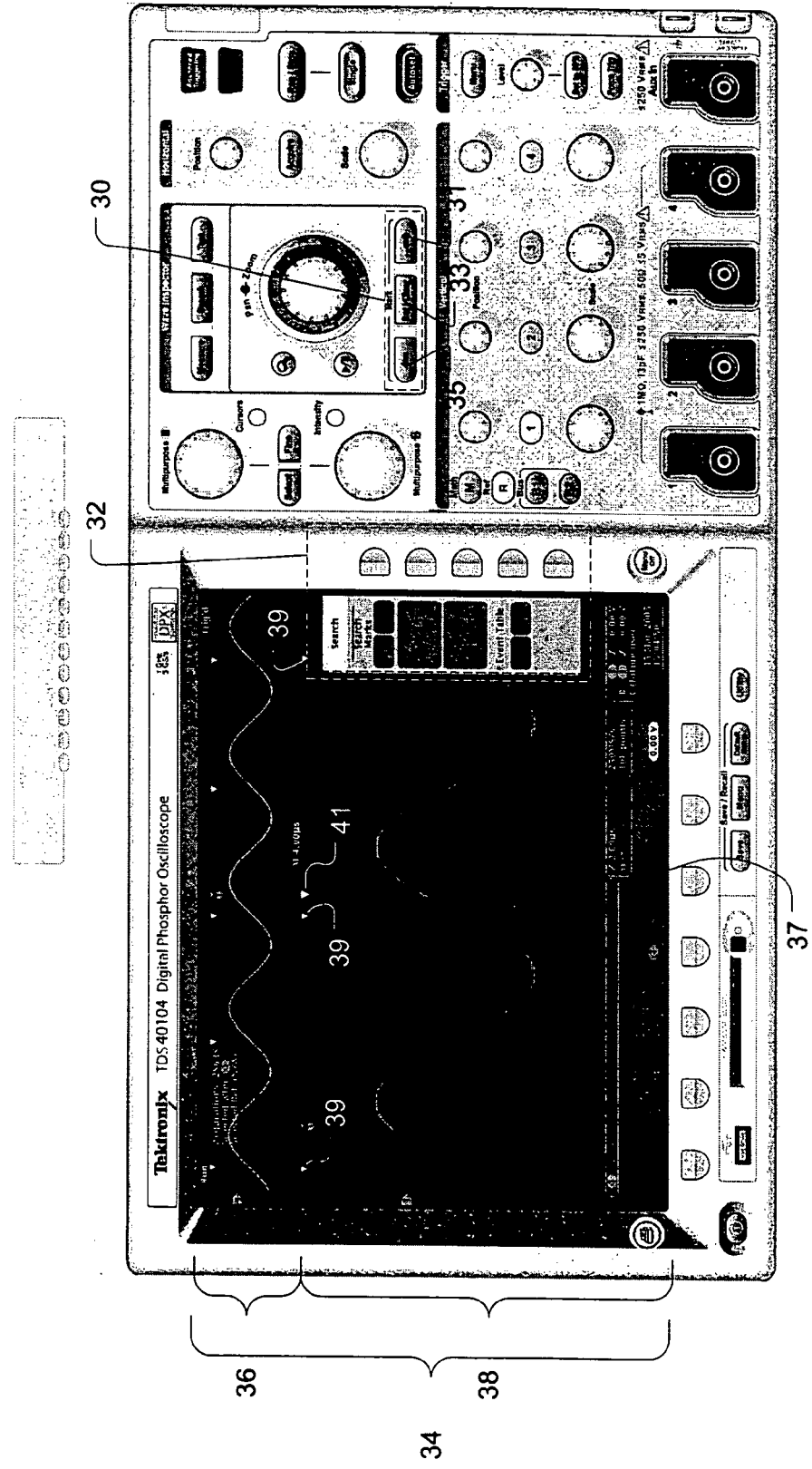
FIG. 2 is an image of a front panel of an oscilloscope according to an embodiment of the invention.

FIG. 2 is an image of a front panel of an oscilloscope according to an embodiment of the invention. An example of the manual mark interface 22 includes the buttons within region 30. The region 30 includes next 31 and previous 35 mark buttons, and a set/clear mark button 33. Through this interface a user may create marks through the set/clear mark button 33.

When a user presses the set/clear mark button 33, a mark is created. An indicator such as a mark indicator 41 in the display 34 indicates the relationship of the mark and the digitized signal. In this example, the feature was the location in the digitized signal corresponding to location of the center 37 of the zoom window 38. The set/clear mark button 33 generated the manual mark creation signal. In response, the processor 12 identified the center 37 of the zoom window 38 and created a mark.

Returning to FIG. 1, the mark search interface 20 is configured to generate a search mark creation signal. The processor 12 is configured to identify features of the digitized signal matching the search criterion, and create marks associated with the identified features in response to the search mark creation signal. The marks created through such searching may be referred to as search marks.

Through the mark search interface 20, the user may input a search criterion identifying a feature for which to search. The mark search interface 20 generates the search mark creation signal causing the processor 12 to search through the digitized signal for matches to the search criterion. Other controls can allow the user to activate the search, stop the search, or set a period of the recurrence of the search.

Search marks may be established on a one time basis, or may be periodically updated. For example, in response to the search mark creation signal, the processor 12 may only search once through the digitized waveform to identify features. Alternatively, the processor 12 may periodically search on each acquired digitized signal, or after a period of time has elapsed. Any scheme of recurring searching may be used. Furthermore, the processor 12 may make recurring searches may be made in response to a single search mark creation signal.

The search criteria may include one or more features such as triggerable features, digital signal patterns, measurements, waveform shapes, and the like. Anything that may define a feature may be a search criterion. For example, the user may enter a feature similar to an edge trigger to see where else in the digitized signal a trigger may have occurred. In addition, the user may set up criteria representing more complex triggers to narrow down triggering events to a particular feature that interests the user. Any such criteria suitable for triggering may be used.

In another example, the search criteria may include digital signal patterns representing data encoded in a digital signal. For example, a search criterion may be a specific or range of addresses, or the start of every address. Thus, the user can search for specific data within the digitized signal.

In addition, any measurements may be used as a search criterion For example, a particular period, frequency, cycle mean, overshoot, or other measurements that may be made on the digitized signal may be used as criteria. Similarly, a particular waveform shape may be used as a search criterion. For example, communication signal standards often have a mask defining acceptable signal shapes. The search criterion may be established so that the processor 12 searches the digitized signal for violations of the mask.

Referring again to FIG. 2, as features are identified and marks are created, the marks may be displayed on the display 34. The marks may be displayed in a zoom window 38 if the associated portion of the digitized signal is also displayed. In addition, the marks may be displayed in an overview window 36. Thus, with search marks, even if no marks were created that appear within the zoom window 38, a user may still be aware of the existence of newly created marks through the overview window 36.

An example of a mark search interface 20 is illustrated in region 32. Here, the mark search interface 20 includes a context-sensitive soft-menu as part of the display 34 and physical buttons. Examples of indicators of search marks are illustrated with mark indicators 39 in the zoom window 38. In this example, the feature of the digitized signal was a rising edge of the displayed digitized signal. Multiple rising edges were found, resulting the in multiple mark indicators 39.

Referring again to FIG. 1, the mark navigation interface 24 is configured to generate a next mark signal. In response, the processor 12 is configured to determine a next mark in response to the next mark signal, and configured to the display 14 to display the next mark and the associated digitized signal.

With identified marks, the user gains the advantage of the marks by easily navigating through the marks. The mark navigation interface 24 may include a next mark interface and a previous mark interface. By activating the next mark interface, the processor 12 determines which mark should be displayed next. Appropriate signals are generated to cause the display 14 to display a portion of the digitized signal associated with the next mark. In particular, if the display 14 includes a zoom window, the zoom window may be updated to display the newly selected mark. Similarly, by activating the previous mark interface, the processor 12 determines a previous mark to be displayed on the display 14.

Through the mark navigation interface 24, the user may arbitrarily move from one mark to any other mark. Thus, the user may easily return to any marked feature.

As described above, both manual marks and search marks may be created. Through the mark navigation interface 24, the treatment of the marks may be defined. For example, the mark navigation interface may be configured such that only manual marks are selected for the next mark. Thus, the mark navigation interface 24 will step only through the manual marks. Alternatively, only marks associated with a particular class of features may be available for the next mark. For example, the mark navigation interface 24 may allow navigation through marks related to a violation of an overshoot portion of a signal mask, rather than any violation of the mask. Any combination of types of marks may be used for navigation.

Furthermore, although next and previous have been used in connection with the relationship of marks, such terms are used to provide examples. Furthermore, a next mark need not be a subsequent mark. For example, a next mark may be the next previous mark.

In addition, although a next and previous mark interface have been described in reference to the mark navigation interface 24, the mark navigation interface 24 can include a variety of specific interfaces. For example, dedicated buttons may be defined for specific marks. Thus, a user may associate a mark and a dedicated button to quickly return to that mark without scanning through specific marks. In addition, the mark navigation interface 24 may include an interface allowing a user to select a mark.

Once marks are defined, measurements may be made using the marks. The mark interface 16 includes a mark measurement interface 26 configured to generate a measurement signal. The processor 12 is configured to generate a measurement using the mark in response to the measurement signal. Through the mark measurement interface 26, measurements may be defined relative to the marks.

In one example, the count of marks may be a measurement. Other measurements may use one or more marks. For example, another measurement may be the pulse width after a mark identifying a rising edge of the digitized signal. Alternatively, another measurement may be a time between two marks identifying the beginning of two different data packets. Any combination of marks and measurements is possible.

Although the mark interface 16 and the specific interfaces have been described as distinct from the processor 12, components and operations may be distributed as desired between the processor 12 and the mark interface 16. For example, the mark interface 16 may include a set mark button. The button generates an electrical signal that the processor 12 receives and interprets as a mark creating signal. Alternatively, a process running on the processor 12 may poll for the status of the button. In response to a state of the button, the process may generate the mark creation signal. Thus, the mark interface 16 includes the process running on the processor 12.

By using such a test and measurement instrument with marks, a user may easily identify and navigate among interesting features within one or more digitized signals. Marks may be manually set or discovered through configurable search criteria. For example, when the user finds an interesting event, he can push just one button—"set/clear". When the user is no longer interested in that event, he can push that same "set/clear" button. When the user wants to move to a different mark, he can push just one "next" or "previous" button. Interesting features may be marked and displayed with ease.

Figure 3:
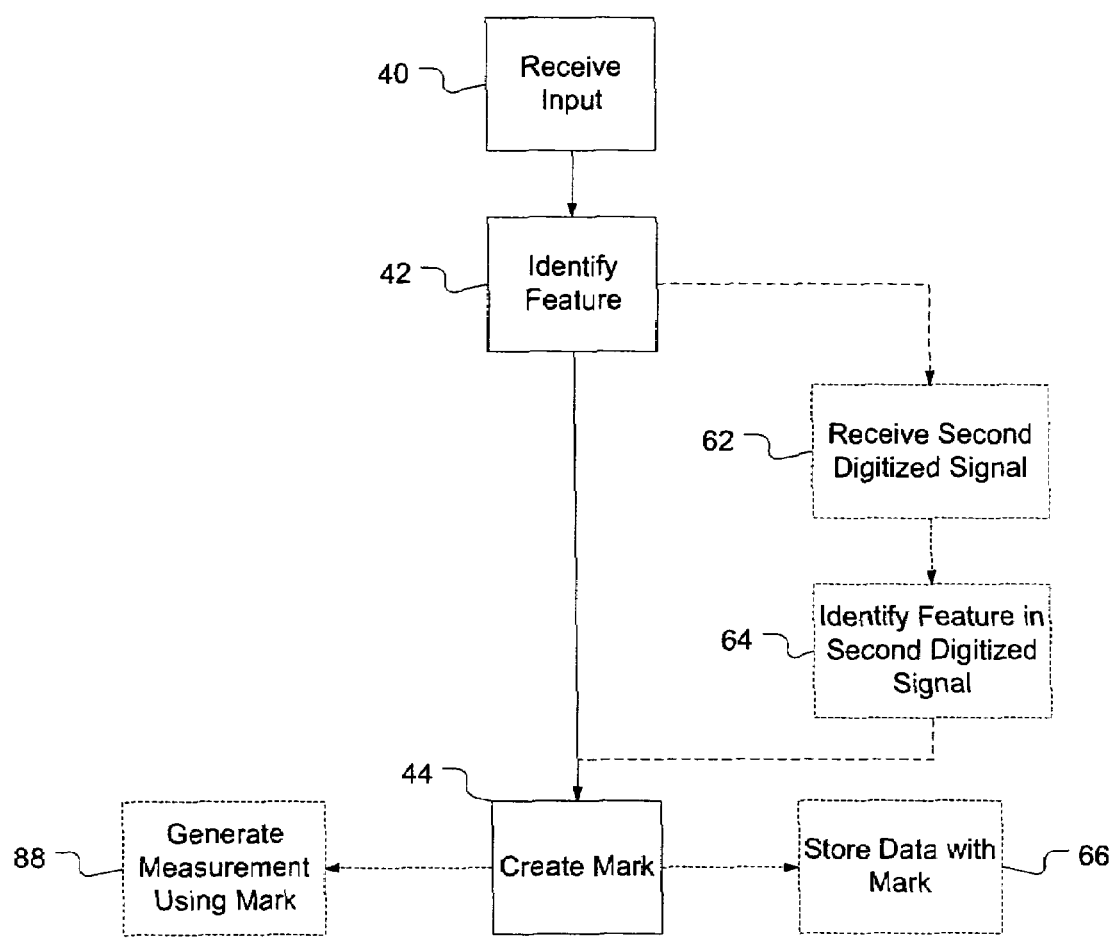
FIG. 3 is a flowchart illustrating a method of operating a test and measurement instrument according to an embodiment.

FIG. 3 is a flowchart illustrating a method of operating a test and measurement instrument according to an embodiment. The method includes receiving an input in 40, identifying a feature of a digitized signal in response to the input in 42, and creating a mark indicating the associated feature and the digitized signal in 44. Thus, in response to an input, a mark indicating an associated feature and digitized signal is created.

More than one digitized signal may be received by the instrument. Thus, in 62, a second digitized signal is received. The feature is identified on the second digitized signal in 64. A mark is created in 44 associated with the feature and any digitized signal with the feature. Alternatively, a mark may be created for each digitized signal having the feature.

Although a processor 12 of FIG. 1 has been described as identifying a feature, identifying the feature of the digitized signal in 42 may be implemented in other ways. For example, acquisition circuitry or other dedicated hardware may identify features. Other processing devices in the instrument may identify features. In addition, a user input may identify a feature. Furthermore, the identification may be performed by any combination of such circuitry and devices.

Figure 4:
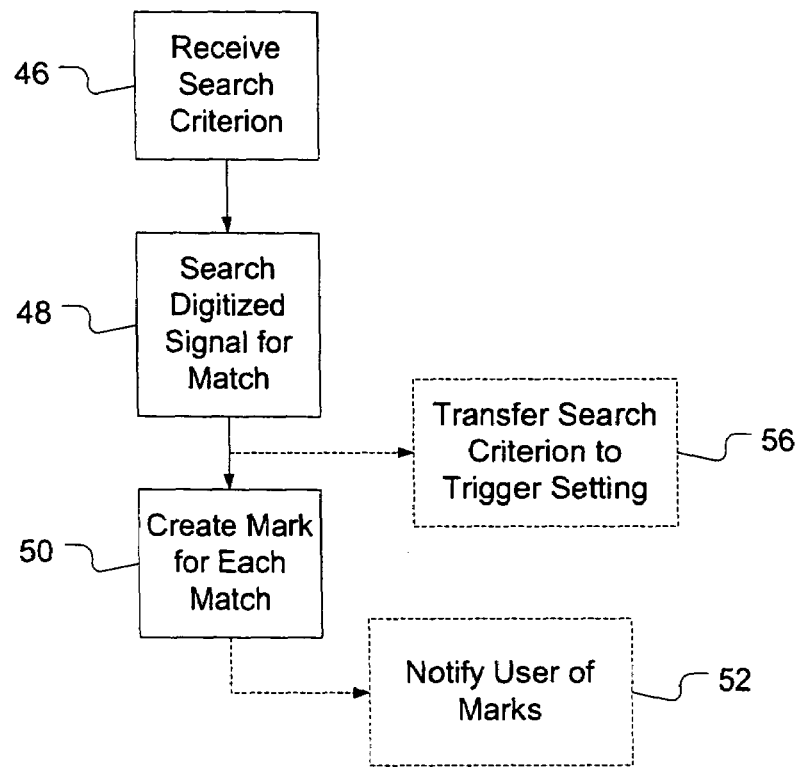
FIG. 4 is a flowchart illustrating searching a digitized signal for features in a method of operating a test and measurement instrument according to an embodiment.

As described above, marks may be created through searching. FIG. 4 is a flowchart illustrating searching a digitized signal for features in a method of operating a test and measurement instrument according to an embodiment. Receiving the input in 40 (FIG. 3) may include receiving a search criterion in 46. As described above, the search criterion may be any desired characterization of the digitized signal or identification of a feature.

Identifying the feature of the digitized signal in 42 includes searching the digitized signal for a feature matching the criterion in 48. For each such feature matching the search criterion, a mark is created in 50. Thus, marks matching the search criterion are created and are available to the user for display, navigation, measurement or any desired manipulation.

Furthermore, a search may be made on multiple search criteria. For example, the search criteria may include both rise times greater than 1 ns. and pulse widths less than 10 ns. The search would search for both features, and marks would be created for any identified features. Furthermore, various search criteria may be combined together to search for one feature. Using the example above, the desired feature may be a pulse with a width less then 10 ns. having a rise time of one edge greater than 1 ns. Regardless of the number of search criteria, the resulting search marks may include identifiers to distinguish which search criterion was used to find the feature associated with the mark.

A user may be notified of marks associated with identified features in 52. For example, a search criterion may be established for an intermittently occurring event. When such an event is discovered, the user may be notified. Such notification may include, for example, stopping acquisition, generating an audible alert, sending an email, taking a screenshot, or any other notification to inform the user that an event satisfying the search criterion has been met. Through the use of marks, a user may quickly navigate to the discovered event for analysis.

Figure 5:
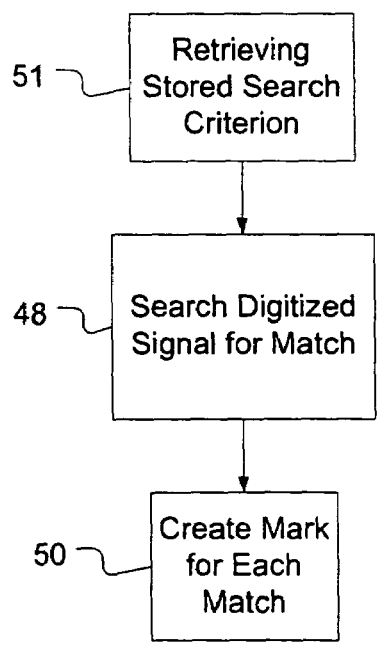
FIG. 5 is a flowchart illustrating retrieving a stored search criterion in a method of operating a test and measurement instrument according to an embodiment.

The search criteria may be stored. In one example, a user may be interested in specific aspects of acquired digital signals. The user may define search criteria defining those aspects. FIG. 5 is a flowchart illustrating retrieving stored search criterion in a method of operating a test and measurement instrument according to an embodiment. The stored search criteria may be retrieved to be used as the search criteria in 51. Such storage may be within the setup of the instrument. Thus, a user may quickly recall a search criterion, acquire a signal, and begin observing the aspects of the signal that commonly interest the user. In particular, if multiple users use the same instrument for different purposes, the overhead of modifying the instrument settings is reduced, increasing efficiency.

Figure 6:
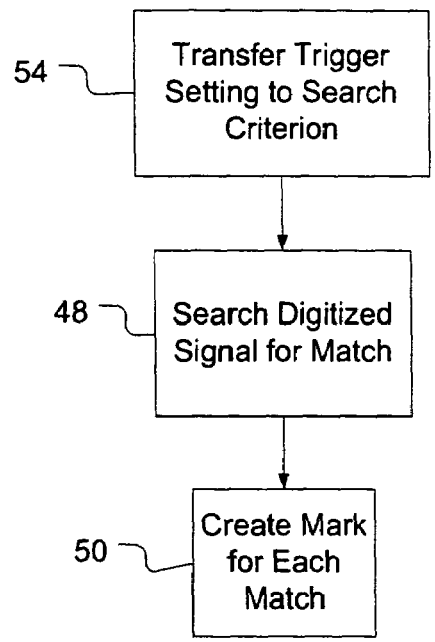
FIG. 6 is a flowchart illustrating transferring trigger settings to a search criterion in a method of operating a test and measurement instrument according to an embodiment.

As described above, search criteria may include features that are commonly associated with trigger settings. For example, rising edges or falling edges may be used as search criteria. FIG. 6 is a flowchart illustrating transferring a trigger setting to a search criterion in a method of operating a test and measurement instrument according to an embodiment. In 54, the trigger settings is transferred to the search criterion. As a result, search marks may be created for each point in the digitized signal that may have been a trigger point. Such a transfer is particularly valuable in that both search criteria and trigger criteria may be time consuming to set up. By transferring the settings, the user need only set up the criteria once. Similarly, as illustrated in FIG. 4, the search criterion can be transferred to the trigger setting in 56.

Figure 7:
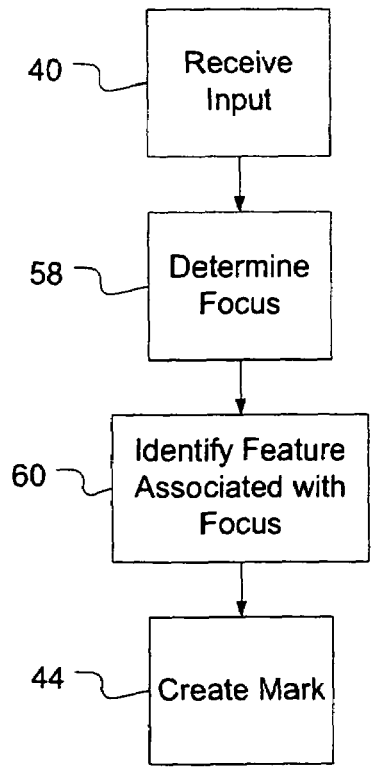
FIG. 7 is a flowchart illustrating identifying features associated with a focus in a method of operating a test and measurement instrument according to an embodiment.

As described above, a focus may be used to create marks. FIG. 7 is a flowchart illustrating identifying features associated with a focus in a method of operating a test and measurement instrument according to an embodiment. Identifying the feature 42 may include determining a focus associated with the input in 58, and identifying the feature associated with the focus in 60. Thus, when an input is received in 40 that results in the creation of marks in 44, a focus is determined in 58 to establish which digitized signals will have associated marks. Determining the focus associated with the input in 58 may include a variety of methods as described above.

Additional data may be stored with a mark. Referring again to FIG. 3, the method may include storing at least one of a unique identifier, digital signal identifiers, and instrument settings with the mark in 66. A variety of marks may have a variety of common characteristics. A unique identifier allows a user to distinguish between similar marks.

Furthermore, a mark may be associated with more than one digital signal. As describe above, the mark may be associated with one digital signal, yet was generated from a feature on a different digital signal. The other digital signal may be cross-referenced in the mark.

In addition, instrument settings may be stored with the mark. For example, zoom factor, whether horizontal, vertical, radial, or otherwise, may be stored with the mark. Thus, when a mark is selected, the display may change to the zoom factor associated with the mark. As a result, the user may see the feature of the digitized signal at the same level of detail as when the mark was created. Other settings of the instrument may be stored with the mark to return the state of the instrument to what it was when the mark was created.

Figure 8:
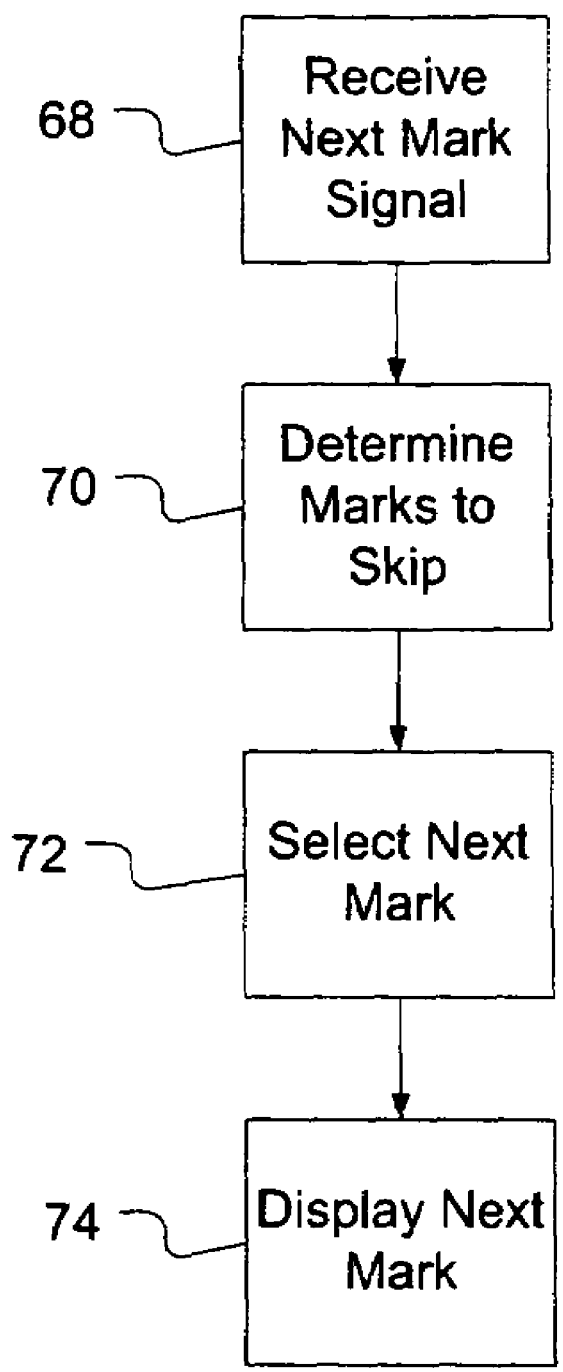
FIG. 8 is a flowchart illustrating selection and displaying of marks in a method of operating a test and measurement instrument according to an embodiment.

FIG. 8 is a flowchart illustrating selection and displaying of marks in a method of operating a test and measurement instrument according to an embodiment. In 68, a next mark signal is received. Related marks are determined in 70. A next mark is selected in response to the related marks 72. The next mark and associated digitized signals are displayed in 74.

In one example, when several marks are created, in particular, when several manual marks are created, the marks may overlap. As a result, when displayed by visible indicators, the marks may appear to be only one mark. Without some indication of the multiple marks, a user may be unaware that the displayed mark indicates multiple marks. Thus, when navigating through the marks, a user may press a next mark button, yet the display will not appear to move. In fact, the display has updated, yet since the next mark overlapped the previous mark, no change occurred to the display.

When multiple marks are displayed as one overlapping mark, those marks may be treated as one mark for the purposes of navigation among the marks. Similar to the directly overlapping marks, visible indicators of marks that are spaced close together may be drawn on the display at the same point due to the pixel resolution of the display. Such marks may also be treated as one mark for navigation purposes.

Thus, in this example, a next mark signal is received in 68. The related marks, determined in 70, include marks that are overlapping or marks that overlap when displayed with the current instrument settings. In response to the related marks, a next mark that does not overlap a current mark is selected in 72. That mark and the associated digitized signals are displayed in 74.

In another example, with any marks that are treated as one mark for navigation purposes, any such marks may be removed from the group of related marks treated as conditions change. For example, as described above, if a digitized signal is moved relative to the other digitized signals, its mark may move a sufficient distance away to be drawn as distinct from the other marks. In another example, if marks are spaced closely together, changing the zoom factor may increase the displayed distance between the marks sufficiently so that the marks are drawn distinct. Thus, when the related marks are determined in 70, the marks that can be drawn distinctly would no longer be determined to be related. As a result, the marks that are drawn as distinct from other marks may be included in the mark navigation.

In another example, even though marks may be drawn in different pixel columns on a display, some marks may be skipped. Marks may be naturally grouped on a digitized signal. For example, an edge of a digitized signal may have a mark at the 10% point, the 50% point, and the 90% point. If the user is zoomed in on the edge, the user may desire to navigate among those marks. Thus, the marks are not skipped.

Alternatively, if a user is zoomed out, examining multiple edges, the visible indicators of the marks may appear closer together, yet not be drawn in the same pixel column. However, the user may want to navigate to the next edge, not the next mark on the same edge. As a result, additional marks on one edge are skipped to navigate to a mark on another edge.

Although examples of the grouping of related marks have been described, any grouping on any criteria may be used to aid in mark navigation. Furthermore, the related marks may be dynamically determined. Using the example above, zoomed in, the edge marks would not be related. However, as the user zooms out, the status of the marks transitions to being related.

Figure 9:
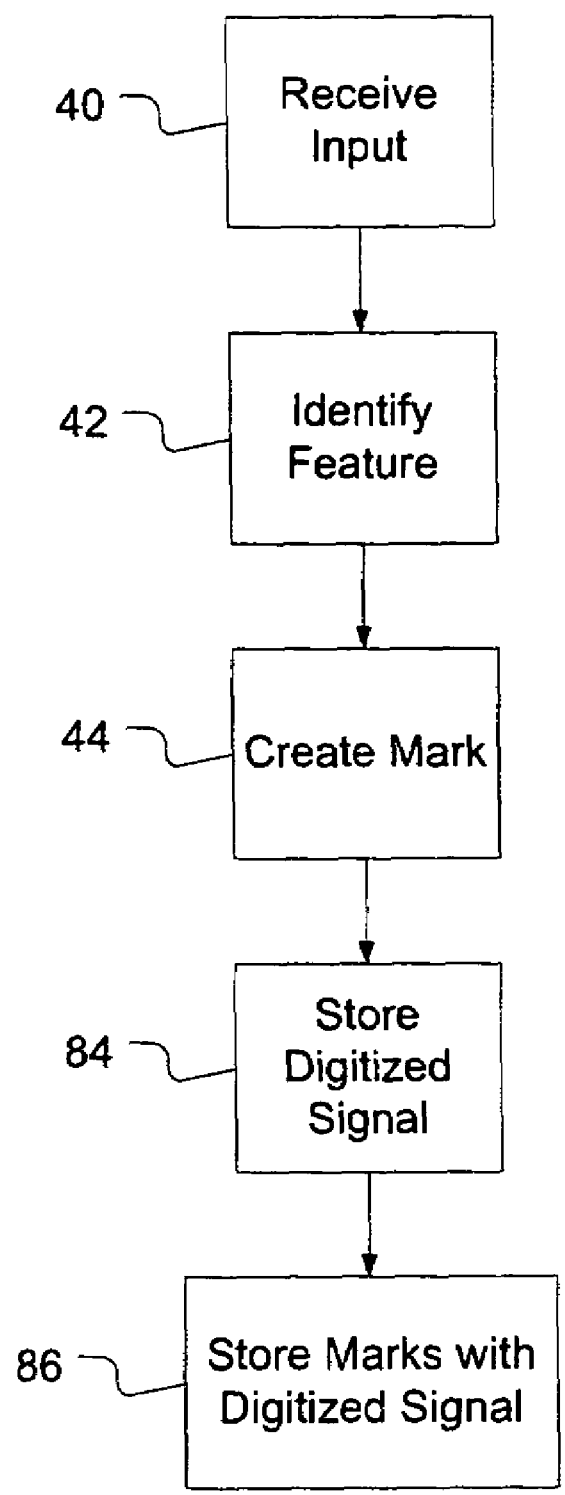
FIG. 9 is a flowchart illustrating storing digitized signals and marks in a method of operating a test and measurement instrument according to an embodiment.

A user may want to discuss a particular digitized signal with a colleague. FIG. 9 is a flowchart illustrating storing digitized signals and marks in a method of operating a test and measurement instrument according to an embodiment. In 84, the digitized signal is stored. In 86, the marks associated with the digitized signal are stored with the digitized signal. Thus, when a stored digitized signal is sent to a colleague, the marks may be recalled for easier reference.

Furthermore, as described above, the marks may include unique identifiers. By referring the colleague to the unique identifier, for example, mark number 4, the colleague will be able to easily find the portion of the digitized signal of interest. The colleague will not have to search through the digitized signal or manually enter a position.

Referring again to FIG. 3, a measurement may be made using a mark in 88. Measurements may be made in a variety of ways. For example, as described above, feature used to place a mark may include a measurement criterion, such as pulse width, rise time, amplitude, or the like. Since the mark has an associated measurement through the feature, that measurement may be generated using the mark.

In another example, marks may be used in combination to create measurements. If one mark is on a rising edge and another mark is on the next falling edge of a digitized signal, both marks may be combined to calculate a pulse width.

Although a variety of examples of methods of operating a test and measurement instrument have been described, individual or groups of operations within the examples may be combined together in various orders to form other methods of operating a test and measurement instrument. Furthermore, although a particular sequence may be illustrated in the FIGURES, the operations may be performed in a variety of sequences, including simultaneous parallel operations.

Another embodiment of a test and measurement instrument includes a means for receiving an input, a means for identifying a feature of a digitized signal in response to the input, and a means for creating a mark associated with the feature.

As described above, a variety of interfaces are available to receive input. The means for receiving an input can include one or more of such interfaces and associated circuitry to transform the input into a desired format. For example, a network interface described above may include appropriate circuitry to transform the network signals into signals usable by a processor.

The means for identifying a feature of the digitized signal may include the processor describe above. In addition, the means for identifying the feature may include any circuitry that can examine the digitized signal. For example, such means may be implemented by dedicated circuitry, programmable logic devices, digital signal processors, general purpose processors, application specific integrated circuits, and the like. The means for creating the mark may be similarly implemented.

Similarly, means for determining a focus associated with the input, and means for identifying the feature associated with the focus may be implemented by various combinations of the above described circuitry.

Furthermore, any of the above-mentioned methods may be implemented through an article of machine-readable code, embodied in a machine-readable medium that, when executed in the machine, causes the machine to perform the method. A machine may be any device or system capable of executing code, such as general purpose computers, application specific integrated circuits, programmable logic devices, digital signal processors, or the like. For example, the processor 12 of FIG. 1 may be controlled through firmware, code, or other data 18 stored in a storage device such as the memory 10 illustrated in FIG. 1. Thus, when an input is received, the code causes the machine to identify features of a digitized signal and create marks associated with the features.

Furthermore, the machine-readable code may include code for a variety of processors or other computing devices that may execute code. Thus, the machine-readable code may include, for example, code such as processor specific code and programmable logic device configuration data. Thus, a device may be manufactured that has the capability of identifying features and creating marks, but in which the capability is not implemented. However, through a subsequent update or retrofit, whether software, firmware, or other code, the functionality may be enabled in the device.

Although digitized signals have been described in relation to a time-based digitized signal, the digitized signal may take any form or presentation format. For example, the digitized signal may be a frequency spectrum or Fourier transform of a time-based signal. The marks and features may pertain to frequency-related characteristics such as signal bandwidth or spectral shape. Alternatively, the digitized signal may be a presented in an X-Y format or a polar-coordinate format such as a 16-QAM (quadrature amplitude modulation) constellation. Any digitized signal format or representation may have associated features and marks.

Although particular embodiments have been described, it will be appreciated that the principles of the invention are not limited to those embodiments. Variations and modifications may be made without departing from the principles of the invention as set forth in the following claims.

The invention claimed is:

1. A method of operating a test and measurement instrument, comprising the steps of:
   receiving an input signal;
   digitizing the input signal;
   receiving a search criterion;
   identifying a feature of a digitized signal in response to the input, the feature being a measurement performed on the digitized signal with respect to time;
   searching the digitized signal for instances of a feature matching the criterion;
   creating a mark indicating the associated feature and the digitized signal; wherein
   the step of creating a mark further comprises creating a mark for each feature matching the search criterion;
   displaying a representation of the input signal and displaying a mark along with the displayed signal; and
   storing the search criterion relating to the mark as a selectable test configuration in said test and measurement instrument; and
   generating a predetermined measurement using data of the digitized signal between a first and a second mark of the related marks.

2. The method of claim 1, wherein receiving the search criterion further comprises the step of retrieving stored search criterion.

3. The method of claim 1, further comprising the step of notifying the user of marks associated with identified features by one of stopping the display of the machine on a particular display, sending an email, and sounding an alarm.

4. The method of claim 1, wherein the step of receiving the search criterion further comprises transferring trigger settings to the search criterion.

5. The method of claim 1, further comprising the step of transferring the search criterion to trigger settings.

6. The method of claim 1, wherein the step of identifying the feature further comprises the steps of:
determining a focus associated with the input; and
identifying the feature associated with the focus.

7. The method of claim 1, further comprising the steps of:
receiving a second digitized signal; and
identifying the feature in the second digitized signal.

8. The method of claim 1, wherein creating the mark further comprises:
storing with the mark at least one of a unique identifier, digital signal identifiers, and instrument settings.

9. The method of claim 1, further comprising the steps of:
receiving a next mark signal;
determining related marks;
selecting a next mark in response to the related marks; and
displaying the next mark and associated digitized signals.

10. The method of claim 1, further comprising the steps of:
storing the digitized signal; and
storing, with the digital signal, marks associated with the digitized signal.

11. A Digital Storage oscilloscope, comprising:
input circuitry at which an input signal is received and digitized;
a memory, the memory storing the digitized signal;
a display screen displaying a representation of the digitized signal in terms of amplitude with respect to time;
a mark interface, the mark interface generating a mark creation signal;
a processor coupled to the memory, the display, and the mark interface;
wherein the processor identifies a feature of the digitized signal and creates and causes display of a mark indicating the feature and its relative placement on the displayed digitized signal in response to the mark creation signal, the feature being a measurement performed on the digitized signal in terms of amplitude with respect to time; and
a mark search interface configured to generate a search mark creation signal;
wherein the processor further identifies multiple instances of the feature in the digitized signal matching a search criterion, and creates and displays marks associated with the identified features and their relative placement on the displayed digitized signal in response to the search mark creation signal;
said marks being displayed on said display screen concurrently with said representation of said digitized signals.

12. The Digital Storage Oscilloscope of claim 11, wherein the mark interface further comprises:
a manual mark interface, the manual mark interface generating a manual mark creation signal in response to user input;
wherein the processor determines a focus associated with the manual mark creation signal, and creates and displays the mark in response to the focus.

13. The Digital Storage Oscilloscope of claim 11, wherein the mark interface further comprises:
a mark navigation interface, the mark navigation interface generating a next mark signal;
wherein the processor determines a next mark in response to the next mark signal, and displays the next mark and the associated digitized signal.

14. A test and measurement instrument, comprising:
input circuitry at which an input signal is received and digitized;
a memory, the memory storing the digitized signal;
a display displaying a representation of the digitized signal;
a mark interface, the mark interface generating a mark creation signal;
a processor coupled to the memory, the display, and the mark interface;
wherein the processor identifies a feature of the digitized signal and creates and causes display of a mark indicating the feature and its relative placement on the displayed digitized signal in response to the mark creation signal, the feature being a measurement performed on the digitized signal with respect to time; and
a mark search interface configured to generate a search mark creation signal;
wherein the processor further identifies multiple instances of the feature in the digitized signal matching a search criterion, and creates and displays marks associated with the identified features in response to the search mark creation signal;
wherein the mark interface further comprises:
a mark measurement interface, the mark measurement interface generating a measurement signal;
wherein the processor performs a predetermined measurement using data between a first and second mark of the multiple marks in response to the measurement signal.

15. The test and measurement instrument of claim 14, wherein the mark interface further comprises:
a manual mark interface, the manual mark interface generating a manual mark creation signal in response to user input;
wherein the processor determines a focus associated with the manual mark creation signal, and creates and displays the mark in response to the focus.

* * * * *